United States Patent
Wanjale et al.

(10) Patent No.: US 11,907,032 B2
(45) Date of Patent: Feb. 20, 2024

(54) GENERATING FAN CONTROL SIGNAL FOR COMPUTING DEVICE

(71) Applicant: Microsoft Technology Licensing, LLC, Redmond, WA (US)

(72) Inventors: Nikita Ramesh Wanjale, Bellevue, WA (US); David Michael Sutherland, Tucson, AZ (US); Jonathan Robert Pease, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 306 days.

(21) Appl. No.: 17/353,510

(22) Filed: Jun. 21, 2021

(65) Prior Publication Data

US 2022/0404882 A1 Dec. 22, 2022

(51) Int. Cl.
*G06F 1/20* (2006.01)
*G06N 20/00* (2019.01)
(Continued)

(52) U.S. Cl.
CPC ......... *G06F 1/206* (2013.01); *G05D 23/1931* (2013.01); *G06F 11/3058* (2013.01);
(Continued)

(58) Field of Classification Search
CPC ...... G05B 13/0265; G05B 2219/42018; G05B 13/027; G05B 6/02; G05B 11/42;
(Continued)

(56) References Cited

U.S. PATENT DOCUMENTS 1,022,109 A * 4/1912 Ryon ..................... D03D 45/20
139/232 E
6,737,824 B1 * 5/2004 Aslan ...................... H02P 23/20
318/471
(Continued)

FOREIGN PATENT DOCUMENTS

WO 2020218632 A1 10/2020

OTHER PUBLICATIONS

"Invitation to Pay Additional Fee Issued in PCT Application No. PCT/US22/029935", dated Sep. 8, 2022, 10 Pages.
(Continued)

*Primary Examiner* — Darrin D Dunn
(74) *Attorney, Agent, or Firm* — Alleman Hall & Tuttle LLP

(57) ABSTRACT

A computing device is provided, including one or more processing devices, one or more temperature sensors, a fan, and a fan tachometer. The one or more processing devices may be configured to execute an application program. While executing the application program, the one or more processing devices may be further configured to collect performance data including temperature data received from the one or more temperature sensors and fan speed data received from the fan tachometer. The one or more processing devices may be further configured to generate a fan control signal at least in part by applying a machine learning model to the performance data. The one or more processing devices may be further configured to control the fan according to the fan control signal.

18 Claims, 15 Drawing Sheets

(51) Int. Cl.
   *G06F 11/30* (2006.01)
   *H05K 7/20* (2006.01)
   *G05D 23/19* (2006.01)
(52) U.S. Cl.
   CPC ......... *G06N 20/00* (2019.01); *H05K 7/20136* (2013.01); *H05K 7/20209* (2013.01)
(58) Field of Classification Search
   CPC ........ G05B 13/048; G05B 2219/40499; G05B 2219/13095; G05B 2219/2614; G06N 20/00; G06N 3/092; F24F 11/30; H05K 7/20209; H05K 7/20836
   See application file for complete search history.

(56) References Cited

U.S. PATENT DOCUMENTS

| | | | | |
|---|---|---|---|---|
| 10,698,457 | B2* | 6/2020 | Lovicott | G05D 23/1919 |
| 11,549,713 | B2* | 1/2023 | Dong | F24F 11/80 |
| 2006/0108962 | A1* | 5/2006 | Murray | G05B 13/024 |
| | | | | 318/610 |
| 2018/0164841 | A1* | 6/2018 | Lovicott | G06F 1/206 |
| 2019/0042979 | A1* | 2/2019 | Devulapalli | G06N 3/006 |
| 2019/0277704 | A1* | 9/2019 | Burger | G01K 1/026 |
| 2020/0285891 | A1* | 9/2020 | Yellin | H04L 67/34 |
| 2020/0326760 | A1 | 10/2020 | Hammer | |
| 2021/0026312 | A1* | 1/2021 | Gervais | G05B 13/027 |
| 2021/0182667 | A1* | 6/2021 | Maeng | G06V 10/764 |
| 2021/0266225 | A1* | 8/2021 | Kozhaya | H04L 41/147 |
| 2021/0341895 | A1* | 11/2021 | Havlena | G06N 7/01 |
| 2022/0269323 | A1* | 8/2022 | He | G06F 1/206 |
| 2022/0299233 | A1* | 9/2022 | Risbeck | G05B 15/02 |
| 2023/0126258 | A1* | 4/2023 | Kikuchi | G06N 20/00 |
| | | | | 706/12 |
| 2023/0168649 | A1* | 6/2023 | Huber | G05B 19/042 |
| | | | | 700/28 |

OTHER PUBLICATIONS

"International Search Report and Written Opinion Issued in PCT Application No. PCT/US22/029935", Oct. 31, 2022, 17 Pages.

* cited by examiner

GENERATING FAN CONTROL SIGNAL FOR COMPUTING DEVICE

BACKGROUND

Computing devices frequently include a fan configured to circulate air through the computing device in order to dissipate heat generated at components of the computing device during operation. The fan may be driven by an electric motor with a speed that is dynamically determined at the computing device. In general, as a speed of the fan increases, noise produced by the fan also increases.

During use of a computing device that includes a fan, noise generated by the fan may distract the user and may thereby detract from the user experience. Sound generated at the fan may also interfere with the user's ability to discern audio outputs produced at the computing device. User distraction by fan noise may occur due to fan noise characteristics such as the overall volume of the fan noise and the change in the volume of the fan noise over time, as well as other fan noise characteristics. The risk of user distraction or annoyance due to fan noise may generally increase as the fan noise increases, and also may be high when the fan speed rapidly increases or decreases, resulting in a sudden increase or decrease in the fan noise. However, components of the computing device may overheat if heat is allowed to build up in such components without the fan circulating air through the computing device. Accordingly, a technical challenge exists to controlling the fan to properly cool the device while inhibiting the generation of noise that is of a type known to cause distraction or annoyance to users.

SUMMARY

According to one aspect of the present disclosure, a computing device is provided, including one or more processing devices, one or more temperature sensors, a fan, and a fan tachometer. The one or more processing devices may be configured to execute an application program. While executing the application program, the one or more processing devices may be further configured to collect performance data including temperature data received from the one or more temperature sensors and fan speed data received from the fan tachometer. The one or more processing devices may be further configured to generate a fan control signal at least in part by applying a machine learning model to the performance data. The one or more processing devices may be further configured to control the fan according to the fan control signal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
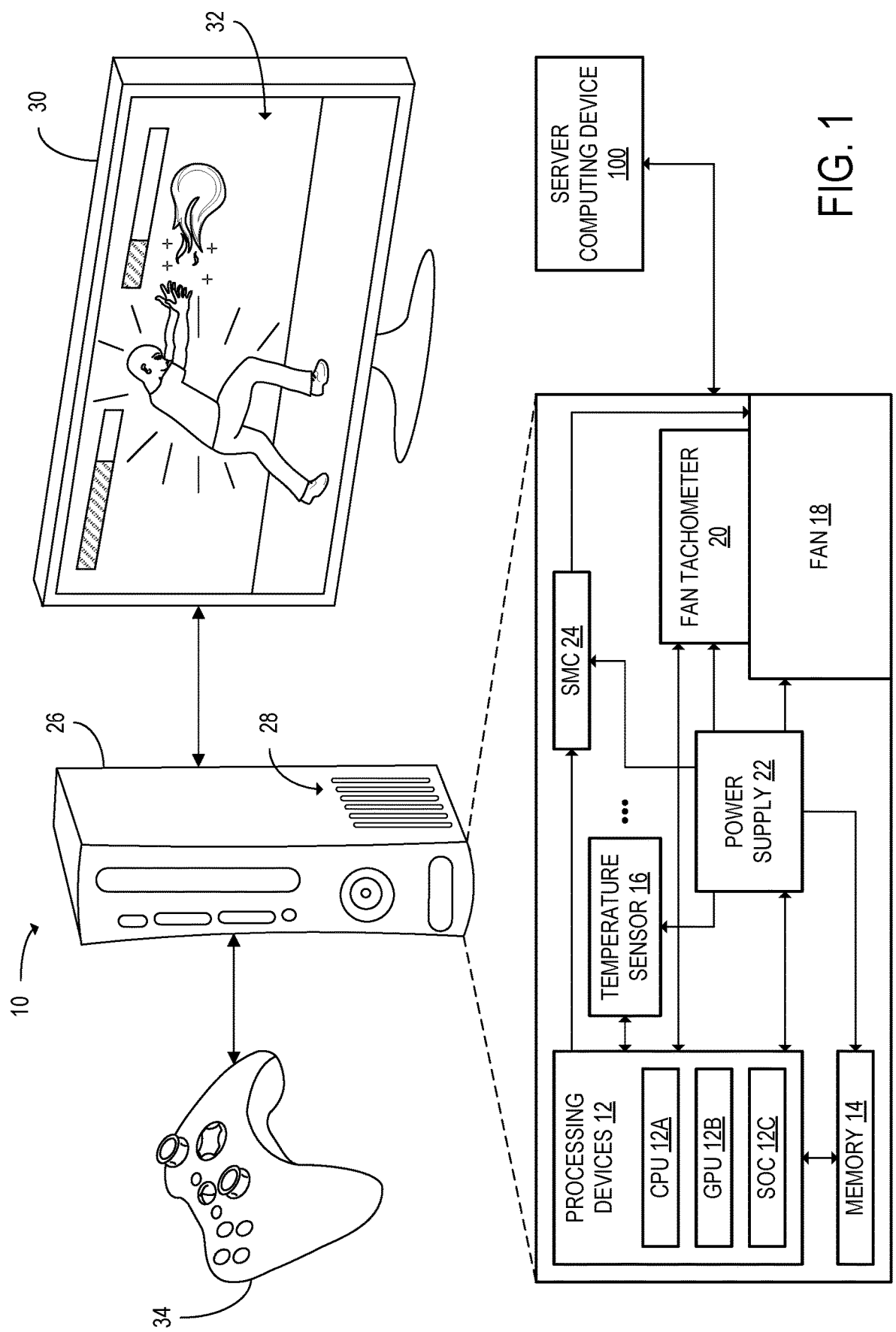
FIG. 1 shows an example computing device in the form of a video game console, according to one embodiment of the present disclosure.

In order to address the above challenges, a computing device 10 is provided, as shown in the example of FIG. 1. In the example of FIG. 1, the computing device 10 is a video game console. However, the computing device 10 may take the form of some other type of computing device in other examples. The computing device 10 may include one or more processing devices 12, which may, for example, include a central processing unit (CPU) 12A, a graphical processing unit (GPU) 12B, and/or a system-on-a-chip (SoC) 12C. Other types of processing device may additionally or alternatively be included in the computing device 10. The computing device 10 may further include memory 14 electrically coupled to the one or more processing devices 12. The memory 14 may, for example, include volatile memory and/or non-volatile memory. In examples, in which the computing device 10 includes an SoC 12C, the SoC 12C may, for example, include components configured to perform the functions of a CPU 12A, a GPU 12B, and memory 14, respectively.

The computing device 10 may further include one or more temperature sensors 16. The one or more temperature sensors 16 may, for example, include one or more thermistors, one or more thermocouples, and/or one or more other types of temperature sensor. The one or more temperature sensors 16 may be positioned proximate to other components of the computing device 10 for which the one or more temperature sensors 16 are configured to collect temperature data. For example, a corresponding temperature sensor 16 may be located proximate to each processing device 12 of the one or more processing devices 12. Additionally or alternatively, a temperature sensor 16 of the one or more temperature sensors 16 may be located proximate to the memory 14. The one or more temperature sensors 16 may be configured to transmit temperature data to the one or more processing devices 12.

The computing device 10 may further include a fan 18 configured to circulate air through the computing device 10. As shown in the example of FIG. 1, the fan 18 may be controlled by a servo motor controller (SMC) 24, which may be configured to receive instructions from the one or more processing devices 12. The computing device 10 may further include a fan tachometer 20 configured to measure a rotation speed of the fan 18. The fan tachometer 20 may be configured to transmit fan speed data to the one or more processing devices 12.

The computing device 10 may further include a power supply 22 configured to provide electrical power to other components of the computing device 10. The power supply 22 may be configured to supply power to the one or more processing devices 12, the memory 14, the one or more temperature sensors 16, the fan 18, the fan tachometer 20, the SMC 24, and/or one or more other components of the computing device 10. In some examples, a temperature sensor 16 of the one or more temperature sensors 16 may be configured to collect temperature data at the power supply 22.

The computing device 10 may further include a case 26 within which the power supply 22, the one or more processing devices 12, the memory 14, the one or more temperature sensors 16, the fan 18, the fan tachometer 20, and the SMC 24 may be provided. The case 26 may have one or more vents 28 via which air may move through the case 26. The fan 18 may be positioned proximate to a vent 28 such that air may move through the vent 28 during operation of the fan 18.

The computing device 10 may be configured to communicate with one or more output devices. As shown in the example of FIG. 1, the one or more output devices may include a display 30 on which a graphical user interface (GUI) 32 may be displayed. In addition, the computing device 10 may be configured to communicate with one or more input devices. In the example of FIG. 1, the one or more input devices include a game controller 34. Other types of input devices and/or output devices may be communicatively coupled to the computing device 10 in other examples.

The computing device 10 may be further configured to communicate with a server computing device 100. For example, the server computing device 80 may be located in a data center and may communicate with the computing device 10 over a network. The one or more processing devices 12 of computing device 10 may be configured to offload one or more computational tasks to the server computing device 100, as discussed in further detail below.

Figure 2:
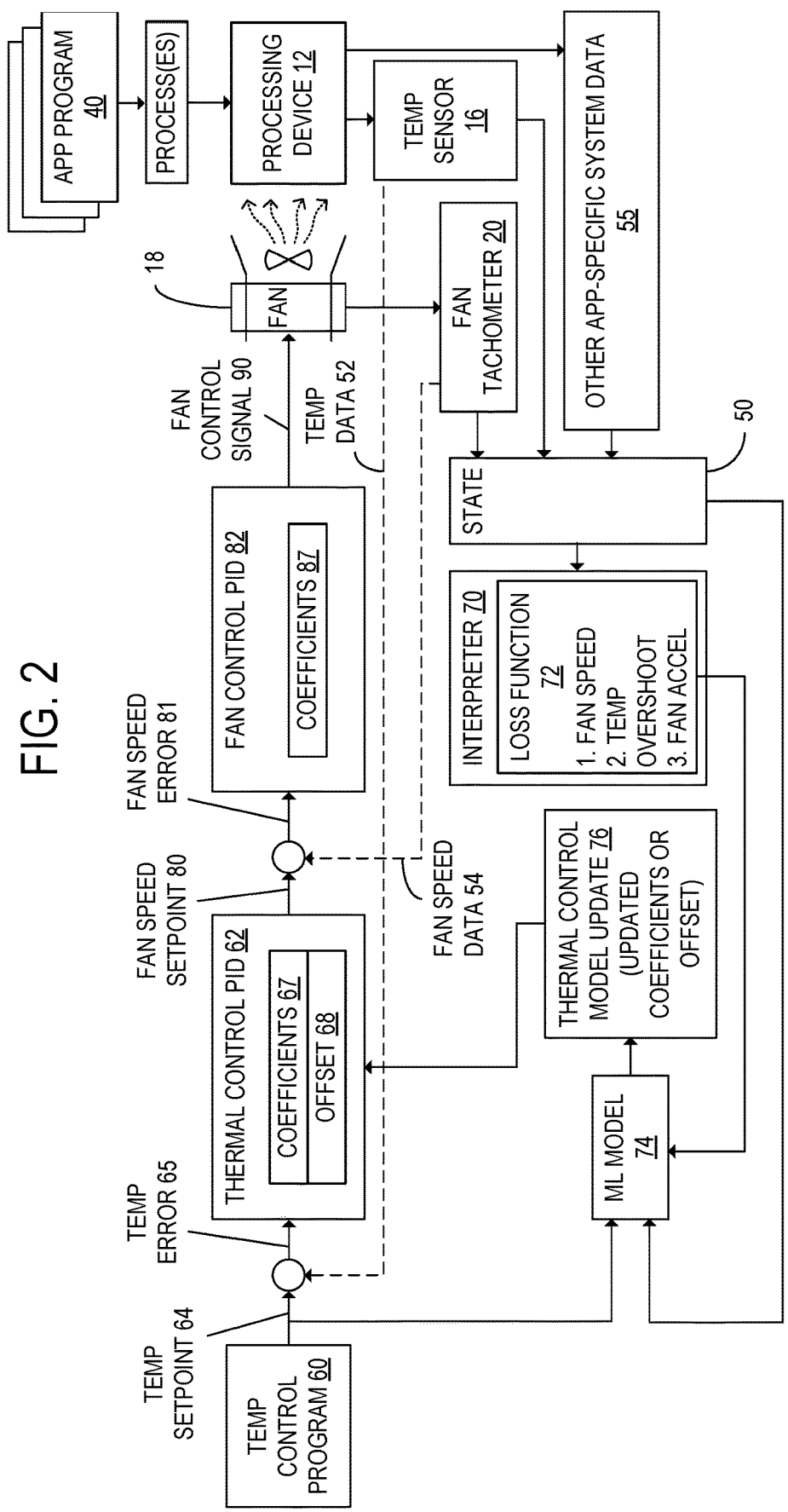
FIG. 2 schematically shows a process by which fan control instructions for a fan included in the computing device may be generated using a machine learning model, a thermal control proportional-integral-derivative (PID) algorithm, and a fan control PID algorithm, according to the example of FIG. 1.

FIG. 2 schematically depicts an example process by which a fan control signal 90 may be generated at the computing device 10 when an application program 40 is executed at the one or more processing devices 12. The application program 40 may, for example, be a video game. Alternatively, the application program 40 may be some other type of application program. The application program 40 may include one or more computational processes that are configured to be executed at the one or more processing devices 12, and may, in some examples, further include one or more computational processes that are configured to be offloaded to the server computing device 100.

While executing the application program 40, the one or more processing devices 12 may be further configured collect performance data 50 for the current session of the application program 40. The performance data 50 may be collected as time series data in which the one or more quantities included in the performance data 50 are sampled at one or more corresponding sampling rates. As shown in the example of FIG. 2, the performance data 50 may include temperature data 52 received from the one or more temperature sensors 16. The performance data 50 may further include fan speed data 54 received from the fan tachometer 20. In addition, the performance data 50 may include other application-specific system data 55 related to the execution of the application program 40 and/or the performance of the one or more processing devices 12.

Figure 3:
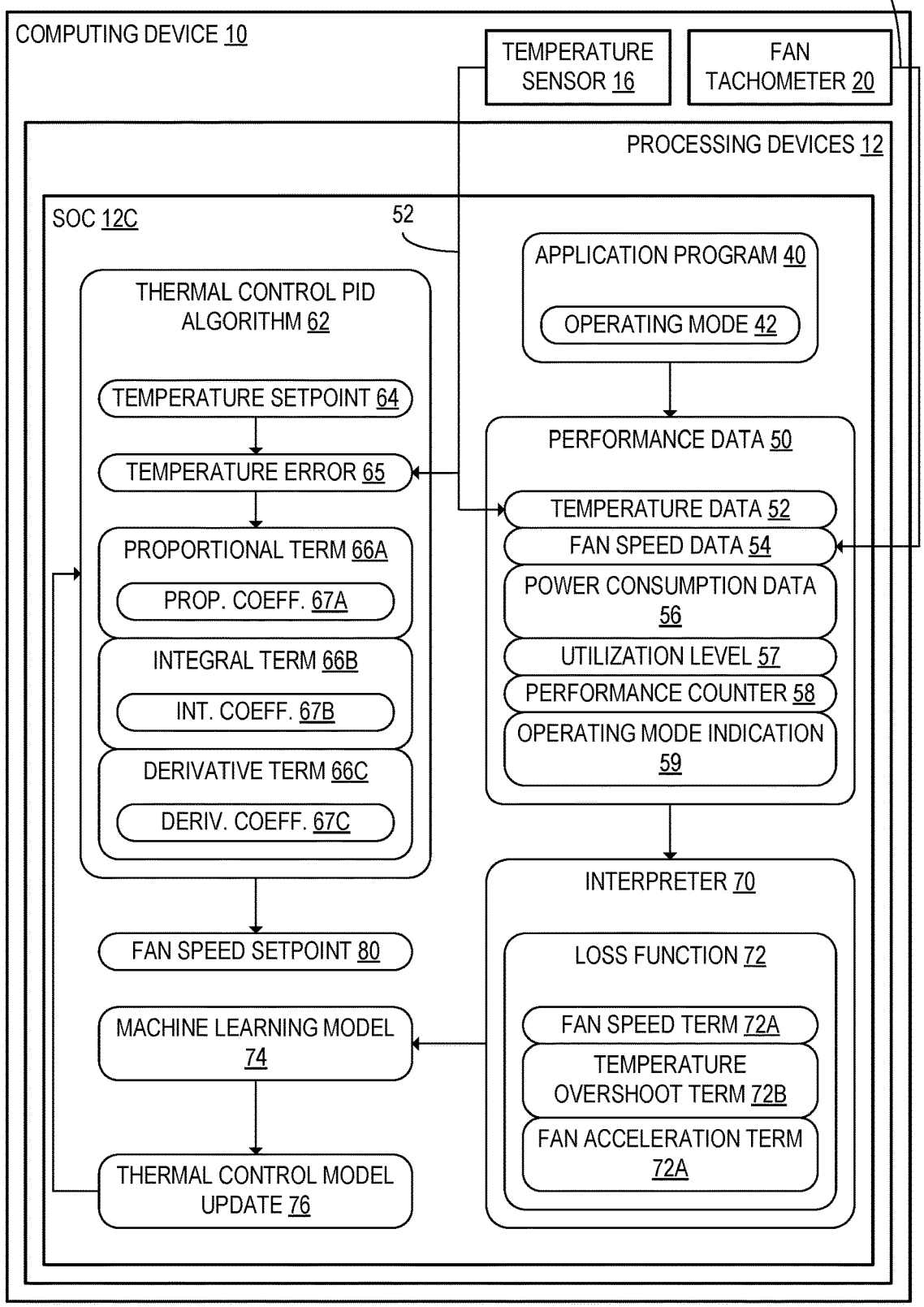
FIG. 3 schematically shows the computing device in additional detail when performance data is received at one or more processing devices, according to the example of FIG. 2.

FIG. 3 schematically shows the computing device 10 in further detail when the performance data 50 is collected and processed at the SoC 12C. The performance data 50 may further include power consumption data 56 of the one or more processing devices 12. In examples in which the performance data 50 includes the power consumption data 56 of a plurality of processing devices 12, the performance data 50 may indicate the power consumption data for the processing devices 12 separately or in aggregate. In some examples, the performance data 50 may further include one or more respective utilization levels 57 and/or one or more respective performance counters 58 of the one or more processing devices 12. The utilization level 57 of a processing device 12 may indicate a proportion of a total processing bandwidth of the processing device 12 that is utilized. The one or more performance counters 58 for a processing device 12 may each indicate a corresponding number of instances of a specific processing hardware event (e.g. a cache miss or a branch misprediction).

In some examples, the one or more processing devices 12 may be configured to determine an operating mode 42 in which the application program 40 is executed. The operating mode 42 may be represented using one or more event markers that may be generated at the application program 40 when entering or exiting a specific operating mode 42. In examples in which the application program 40 is a video game, the operating mode 42 may, for example, be a graphics setting for the video game, a condition in which a particular area or object in a game world is loaded, a condition in which a physics engine is executed, a single-player or multiplayer mode, a condition in which a specific user input or user input combination is received, or some other mode or scenario that may occur when running the video game at the one or more processing devices 12. In examples in which the one or more processing devices 12 are configured to determine the operating mode 42, the performance data 50 may further include one or more operating mode indications 59 of one or more operating modes 42 that occur when the application program 40 is executed.

As shown in the example of FIG. 2, the one or more processing devices 12 may be further configured to generate a fan control signal 90 and control the fan 18 according to the fan control signal 90. The fan control signal 90 may be a duty cycle for the fan 18, which may, for example, be a pulse width modulated (PWM) signal. In some examples, the fan control signal 90 may be conveyed to the fan 18 via the SMC 24. The SMC 24 may, in such examples, be configured to translate a digital fan control signal 90 into an analog signal with which the motor of the fan 18 is controlled.

The one or more processing devices 12 may be configured to generate the fan control signal 90 at least in part by applying a machine learning model 74 to the performance data 50. As depicted in the example of FIG. 2, the machine learning model 74 may be a reinforcement learning model. In examples in which the machine learning model 74 is a reinforcement learning model, the one or more processing devices 12 may be configured to implement an interpreter 70 of the machine learning model 74. At the interpreter 70, the one or more processing devices 12 may be configured to receive the performance data 50 as state data and may be further configured to compute a value of a loss function 72 based on the performance data 50. The machine learning model 74 may be configured to receive the performance data 50 and the value of the loss function 72 as inputs.

In the example of FIG. 2, the machine learning model 74 may be trained during runtime while the application program 40 is executed at the one or more processing devices 12. In some examples, as discussed in further detail below, at least a portion of the training of the machine learning model 74 may instead be performed at the server computing device 100. At least a portion of the training at the server computing device 100 may be performed prior to executing the application program 40 at the computing device 10. Additionally or alternatively, the one or more processing devices may be configured to perform inferencing using the machine learning model 74 during execution of the application program 40 without performing additional training.

As shown in the example of FIG. 3, the loss function 72 may include a fan speed term 72A, which may be computed as a function of a fan speed included in the fan speed data 54. For example, the fan speed based on which the fan speed term 72A is computed may be the fan speed measured at the fan tachometer 20 during a current timestep. The fan speed term 72A may be proportional to the fan speed or to some function of the fan speed, such as the fan speed squared. The fan speed term 72A may be configured to penalize the reinforcement learning model for high fan speeds.

The loss function 72 may further include a temperature overshoot term 72B configured to be added to the value of the loss function 72 when the temperature data 52 indicates a temperature above a predetermined temperature threshold. Thus, the temperature overshoot term 72B may penalize the reinforcement learning model when one or more components of the computing device 10 overheat, as measured by the one or more temperature sensors 16. For example, the temperature overshoot term 72B may be expressed as a coefficient multiplied by a step function of the temperature. In some examples, the loss function 72 may include a plurality of temperature overshoot terms 72B with a corresponding plurality of predetermined temperature thresholds.

The loss function 72 may further include a fan acceleration term 72C in some examples. The fan acceleration term 72C may be computed as a function of a time derivative of the fan speed. For example, the fan acceleration term 72C may be proportional to the absolute value of the time derivative of the fan speed or to the square of the time derivative of the fan speed. The fan acceleration term 72C may be configured to penalize the reinforcement learning model for rapid changes in the fan speed. In some examples, the loss function 72 may penalize increases in the fan speed more highly than decreases in the fan speed that have time derivatives with the same magnitude.

In addition to the machine learning model 74, the one or more processing devices 12 may be further configured to execute a thermal control model when the fan driving signal 90 is computed. The thermal control model may be configured to receive the temperature data 52 and output a fan speed setpoint 80. In examples in which the one or more processing devices 12 are configured to execute a thermal control model, the one or more processing devices 12 may be further configured to apply a thermal control model update 76 to the thermal control model as an output of the machine learning model 74, as discussed in further detail below. Thus, the one or more processing devices 12 may be configured generate an updated thermal control model. The one or more processing devices 12 may be further configured to generate the fan control signal 90 at least in part by executing the updated thermal control model.

As shown in the example of FIGS. 2 and 3, the thermal control model may be a thermal control proportional-integral-derivative (PID) algorithm 62. The thermal control PID algorithm 62 may have a temperature setpoint 64, which may, for example, be set at a temperature control program 60 executed by the one or more processing devices 12. In some examples, the temperature setpoint 64 may also be used as an additional input at the machine learning model 74.

When the one or more processing devices 12 execute the thermal control PID algorithm 62, the one or more processing devices 12 may be configured to compute a temperature error 65 between the temperature setpoint 64 and a temperature included in the temperature data 52 received from the one or more temperature sensors 16. The thermal control PID algorithm 62 may include a proportional term 66A which is proportional to the temperature error 65, an integral term 66B which is proportional to an integral of the temperature error over time, and a derivative term 66C which is proportional to a time derivative of the temperature error 65. The parameters of the thermal control PID algorithm 62 may be expressed as a corresponding plurality of coefficients 67 of the terms. The proportional term 66A, the integral term 66B, and the derivative term 66C may have a proportional coefficient 67A, an integral coefficient 67B, and a derivative coefficient 67C by which the temperature error 65, the integral of the temperature error, and the derivative of the temperature error are respectively multiplied when the fan speed setpoint 80 is computed.

Figure 4:
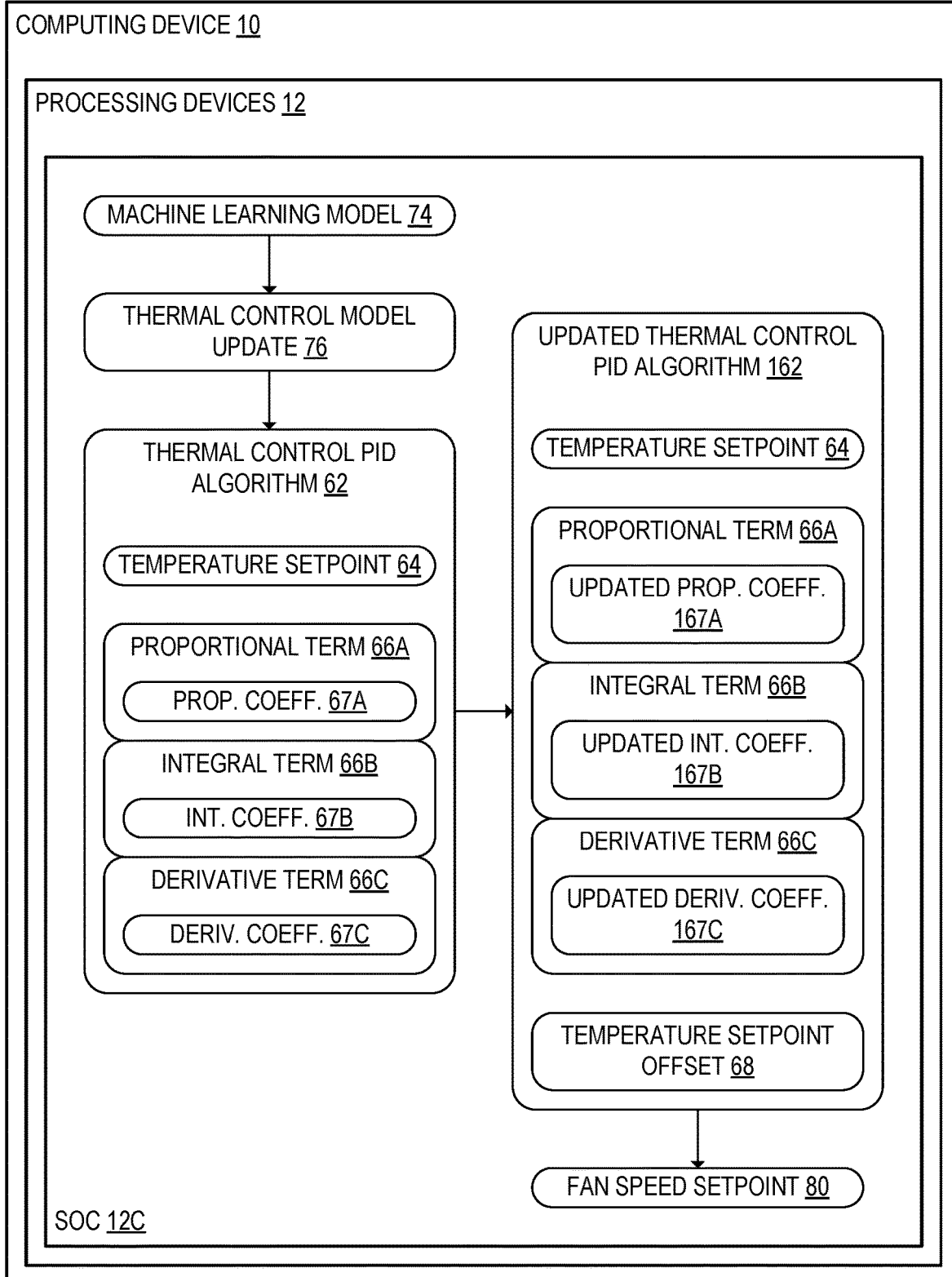
FIG. 4 schematically shows the computing device in additional detail when the thermal control PID algorithm is updated, according to the example of FIG. 3.

At the machine learning model 74, the one or more processing devices 12 may be configured to apply a thermal control model update 76 to the thermal control model. FIG. 4 schematically shows the computing device 10 in additional detail when the thermal control model update 76 is applied to the thermal control PID algorithm 62 to generate an updated thermal control PID algorithm 162. Generating the updated thermal control PID algorithm 162 may, in some examples, include modifying one or more coefficients of the thermal control PID algorithm 62. In such examples, at the machine learning model 74, the one or more processing devices 12 may be configured to generate an updated proportional coefficient 167A, an updated integral coefficient 167B, and/or an updated derivative coefficient 167C for the updated thermal control PID algorithm 162.

In some examples, the thermal control PID algorithm 62 may have a temperature setpoint offset 68 that may be added to the temperature setpoint 64 to dynamically adjust the temperature setpoint 64 while the application program 40 is executed. The temperature setpoint offset 68 may be computed at the machine learning model 74. Accordingly, the one or more processing devices 12 may be configured to apply the thermal control model update 76 to the thermal control PID algorithm 62 at least in part by applying the temperature setpoint offset 68 to the temperature setpoint 64 of the thermal control PID algorithm 62. The temperature setpoint offset 68 may be added to the temperature setpoint 64 when the temperature error 65 is computed. The one or more processing devices 12 may be configured to compute the temperature setpoint offset 68 additionally or alternatively to the one or more updated coefficients when the updated thermal control PID algorithm 162 is generated.

Returning to FIG. 2, the one or more processing devices 12 may be further configured to execute a fan control PID algorithm 82 in addition the thermal control PID algorithm 62 when generating the fan control signal 90. The fan control PID algorithm 82 may be configured to receive, as inputs, the fan speed setpoint 80 output by the thermal control PID algorithm 62 and the fan speed data 54 output by the fan tachometer 20. The fan control PID algorithm 82 may be further configured to output the fan control signal 90.

Figure 5:
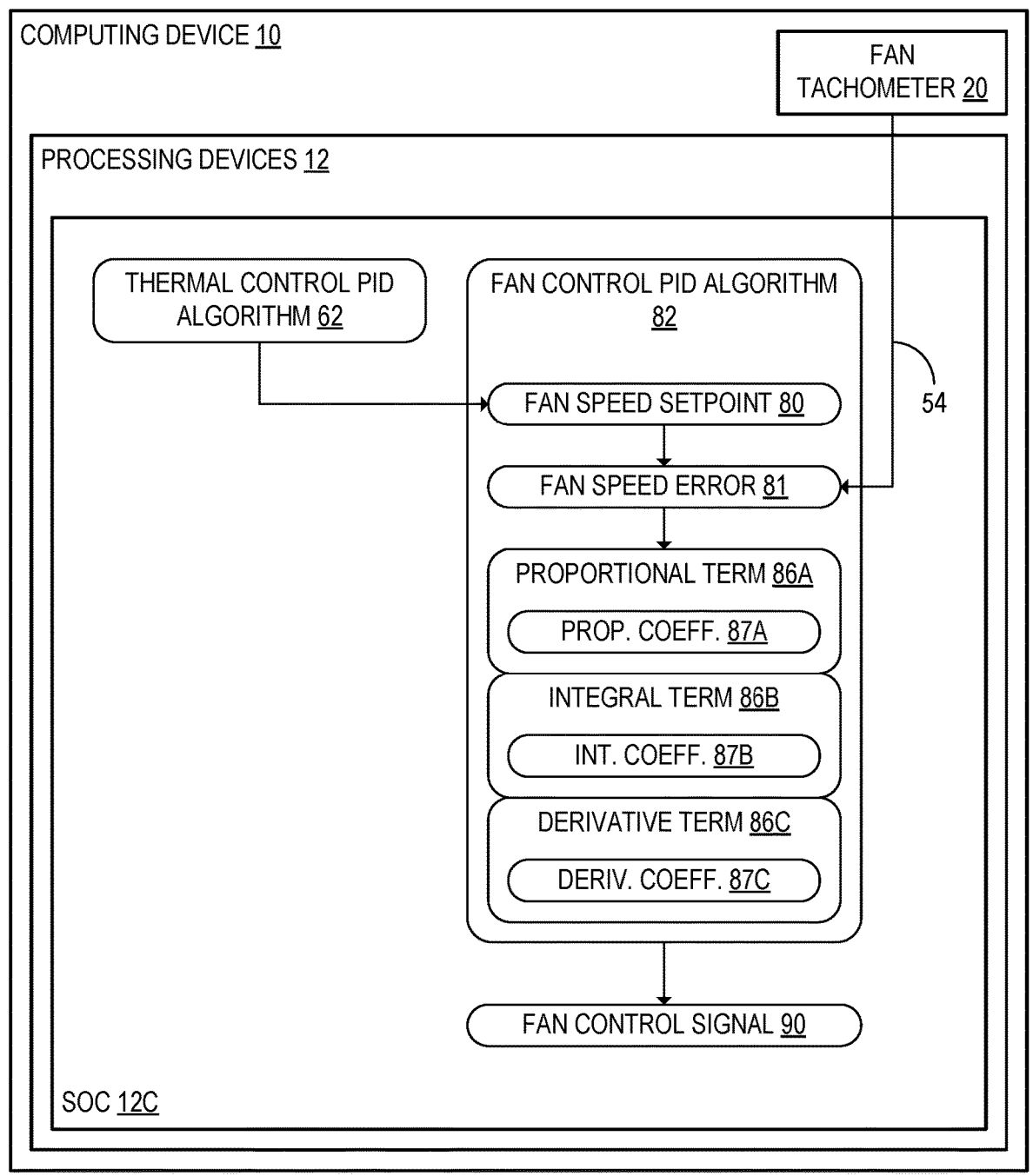
FIG. 5 schematically shows the computing device in additional detail when the fan control PID algorithm is executed, according to the example of FIG. 3.

FIG. 5 schematically shows the computing device 10 in additional detail when the fan control PID algorithm 82 is executed. When the one or more processing devices 12 execute the fan control PID algorithm 82, the one or more processing devices 12 may be configured to compute a fan speed error 81 between the fan speed setpoint 80 and the fan speed indicated by the fan speed data 54. The fan control PID algorithm may have a proportional term 86A which is proportional to the fan speed error 81, an integral term 86B that is proportional to an integral of the fan speed error 81 over time, and a derivative term 86C that is proportional to a time derivative of the fan speed error 81. The parameters of the fan control PID algorithm 82 may be expressed as a plurality of coefficients 87. The proportional term 86A, the integral term 86B, and the derivative term 86C may be multiplied by a proportional coefficient 87A, an integral coefficient 87B, and a derivative coefficient 87C, respectively, when the fan control signal 90 is computed.

Figure 6:
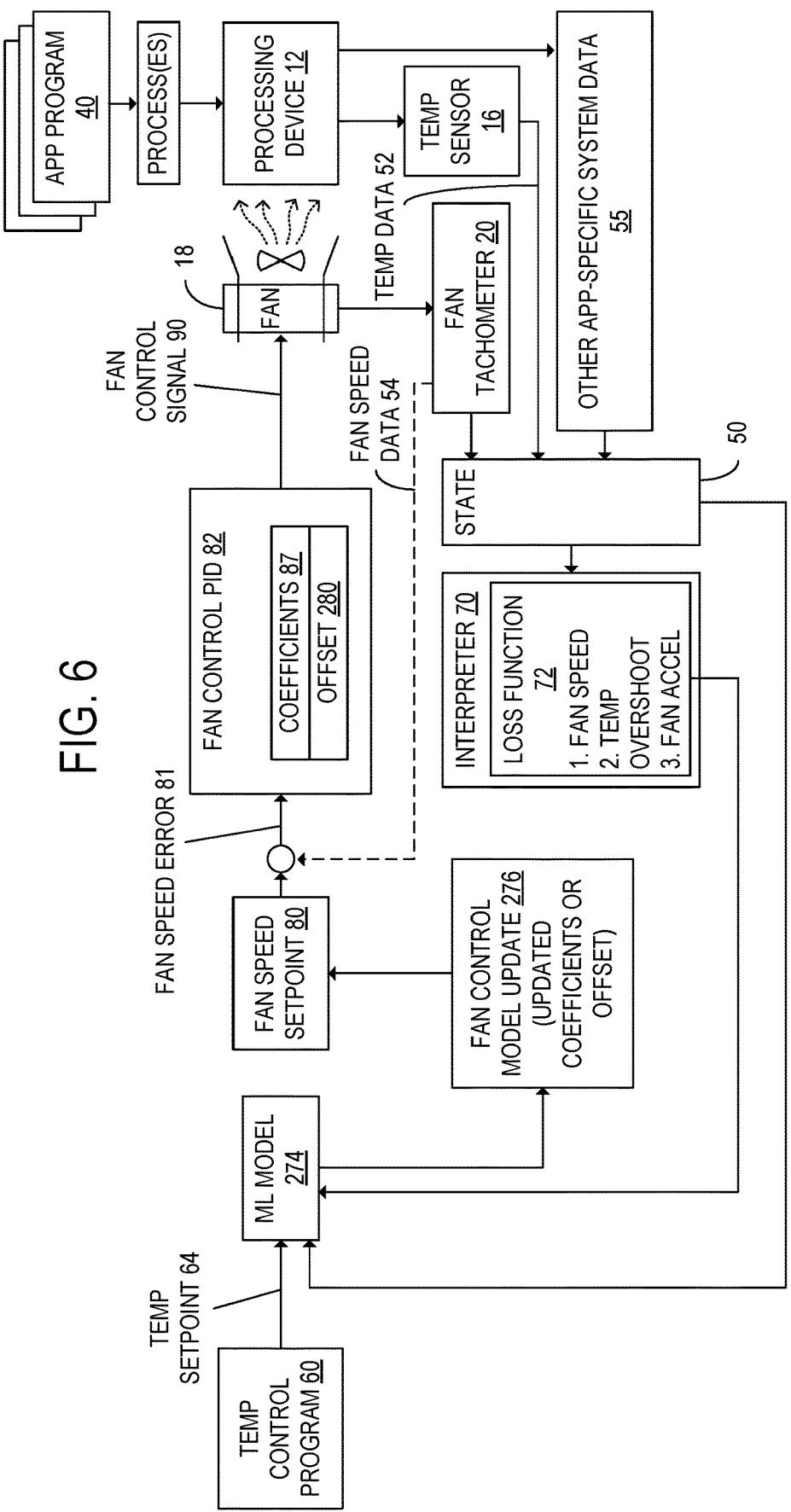
FIG. 6 schematically shows a process by which fan control instructions for a fan included in the computing device may be generated using a machine learning model and a fan control PID algorithm, according to the example of FIG. 1.

FIG. 6 shows another example process by which the one or more processing devices 12 may be configured to generate a fan control signal 90. In the example of FIG. 6, instead of executing the thermal control PID algorithm 62 of FIG. 2, the one or more processing devices 12 may be configured to compute the fan speed setpoint 80 directly at a machine learning model 274. Similarly to the machine learning model 74 of FIG. 2, the machine learning model 274 may be a reinforcement learning model and may be configured to receive, as inputs, the performance data 50, the temperature setpoint 64, and the value of the loss function 72. The loss function 72 may include a fan speed term 72A, a temperature overshoot term 72B, and a fan acceleration term 72C.

Figure 7:
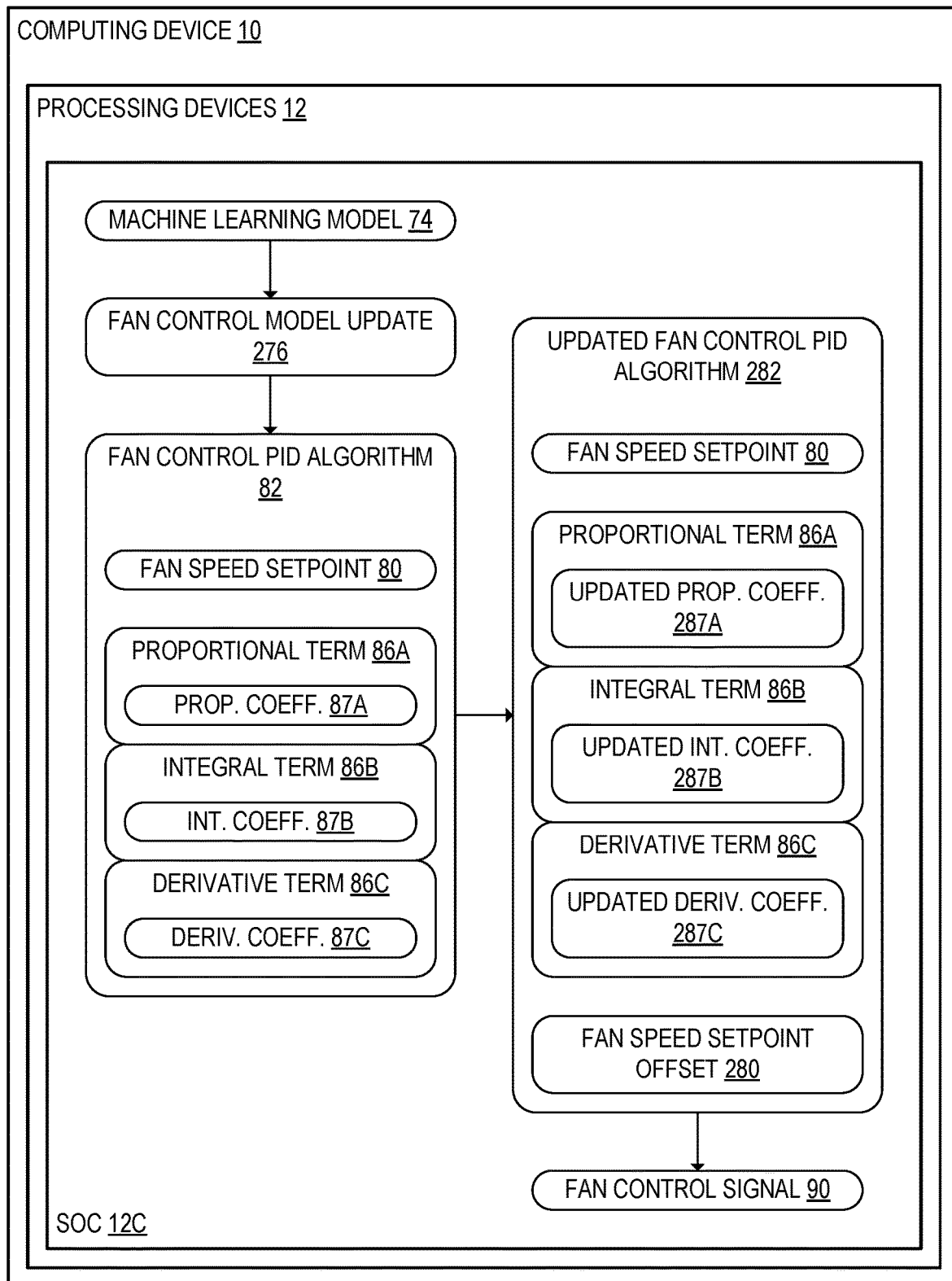
FIG. 7 schematically shows the computing device in additional detail when the fan control PID algorithm is updated, according to the example of FIG. 6.

In contrast to the machine learning model 74 of FIG. 2, the machine learning model 274 of FIG. 6 may be configured to apply a fan control model update 276 to a fan control model to generate an updated fan control model, as shown in the example of FIG. 7. In the example of FIGS. 6 and 7, the fan control model is a fan control PID algorithm 82. The fan control model update 276 may be generated as an output of the machine learning model 274 based at least in part on the performance data 50 and the value of the loss function 72. In some examples, the temperature setpoint 64 may also be used as an input at the machine learning model 274. The fan control model update 276 may include an updated proportional coefficient 287A configured to be included in the proportional term 86A, an updated integral coefficient 287B configured to be included in the integral term 86B, and/or an updated derivative coefficient 287C configured to be included in the derivative term 86C of an updated fan control PID algorithm 282. Additionally or alternatively, the one or more processing devices 12 may be configured to generate, at the machine learning model 274, a fan speed setpoint offset 280 configured to be added to the fan speed setpoint 80 when the fan speed error 81 is computed. Thus, the one or more processing devices 12 may be configured to modify the fan control PID algorithm 82 as specified by the machine learning model 274.

Figure 8:
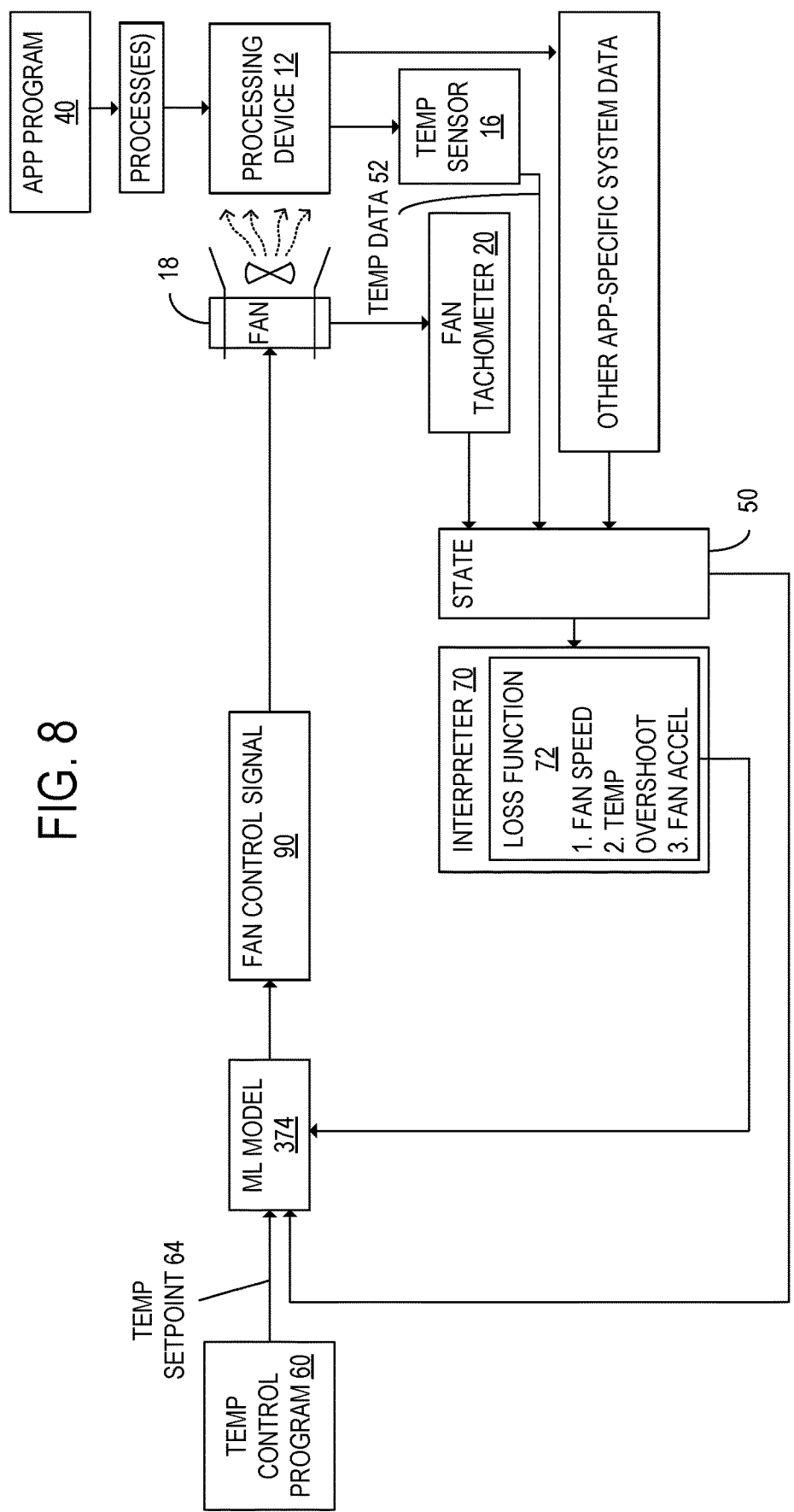
FIG. 8 schematically shows a process by which fan control instructions for a fan included in the computing device may be generated at a machine learning model, according to the example of FIG. 1.

FIG. 8 shows another example process by which the one or more processing devices 12 may be configured to generate the fan control signal 90 at least in part by executing a machine learning model 374. In the example of FIG. 8, the machine learning model 374 is an end-to-end model configured to generate the fan control signal 90 directly from the performance data 50 and the value of the loss function 72. The temperature setpoint 64 may also be used as an input at the machine learning model 374 in some examples.

Figure 9A:
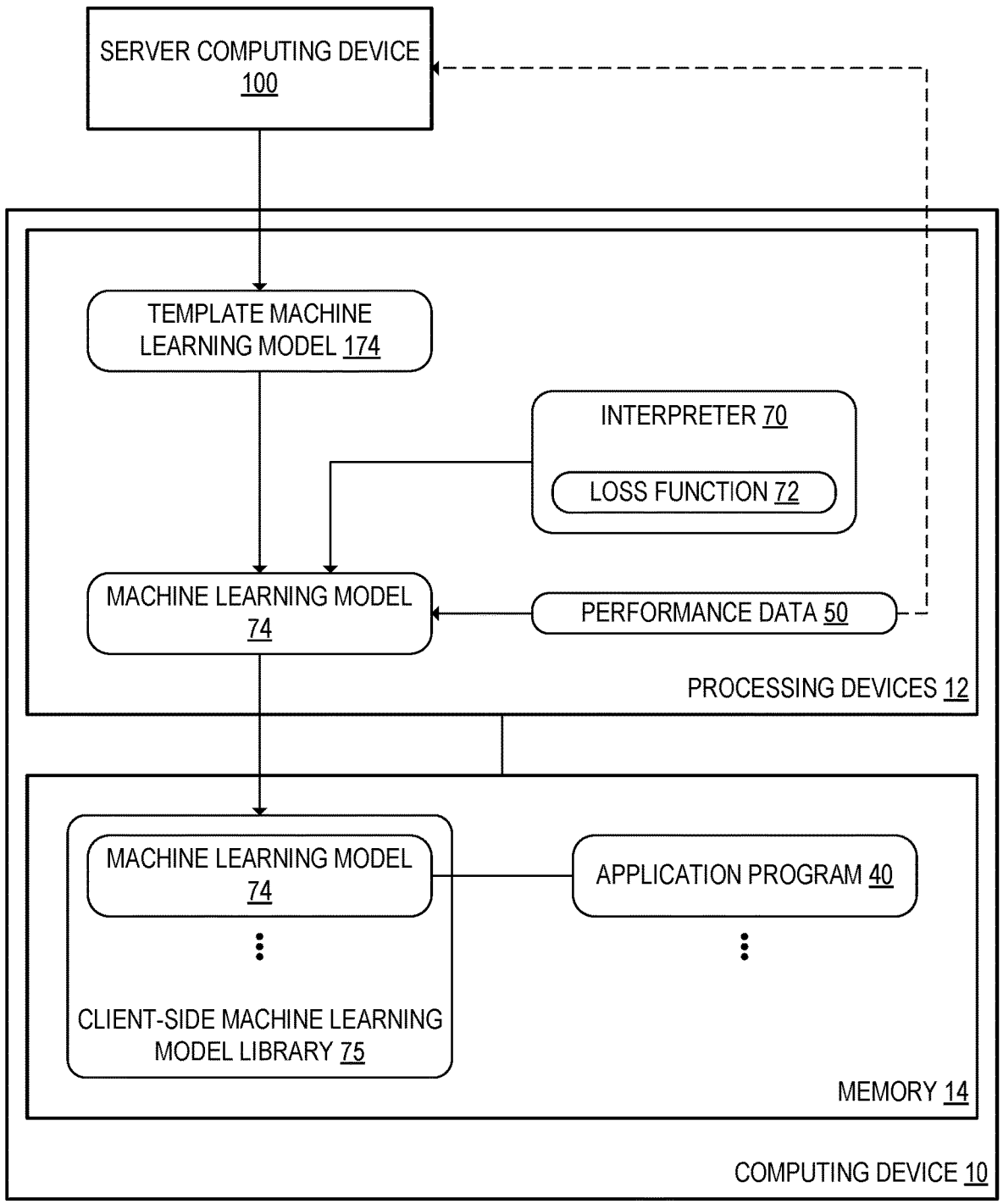
FIG. 9A schematically shows the computing device when the computing device is configured to receive a template machine learning model from a server computing device, according to the example of FIG. 1.

FIG. 9A shows the computing device 10 in an example in which the one or more processing devices 12 are configured to receive a template machine learning model 174 from the server computing device 100. The template machine learning model 174 may be trained at the server computing device 100 using training data collected during execution of the application program 40 at a plurality of computing devices. Thus, the behavior of the template machine learning model 174 may be generalized across the plurality of computing devices from which its training data is received and may also be specific to the application program 40.

The one or more processing devices 12 may be further configured to customize the template machine learning model 174 for the computing device 10 and thereby generate the machine learning model 74. The one or more processing devices 12 may perform additional training on the template machine learning model 174 using the performance data 50 and the loss function 72. Accordingly, patterns in the performance data 50 that are specific to the computing device 10 (e.g. due to characteristics of the physical environment in which the computing device 10 is located) may be represented in the machine learning model 74 after the additional training has been performed.

In examples in which the one or more processing devices 12 are further configured to perform additional training on the template machine learning model 174, the one or more processing devices 12 may be further configured to transmit the performance data 50 to the server computing device 100. The performance data 50 may be used to perform additional training at the server computing device 100 to update the template machine learning model 174.

In some examples, as shown in FIG. 9A, the memory 14 of the computing device 10 may be configured to store a plurality of machine learning models 74 including the machine learning model 74. The plurality of machine learning models 74 may be stored in a client-side machine learning model library 75. The plurality of machine learning models 74 may be respectively associated with a plurality of application programs 40 including the application program 40. Thus, the memory 14 may store different machine learning models 74 for different application programs 40 that have different patterns of hardware utilization and energy consumption. For example, a machine learning model 74 associated with a highly compute-intensive video game may be configured to output a high fan speed setpoint 80 when the video game is launched. In contrast, a machine learning model 74 associated with a less compute-intensive video game may be configured to output a lower fan speed setpoint 80 when the less compute-intensive video game is launched.

Figure 9B:
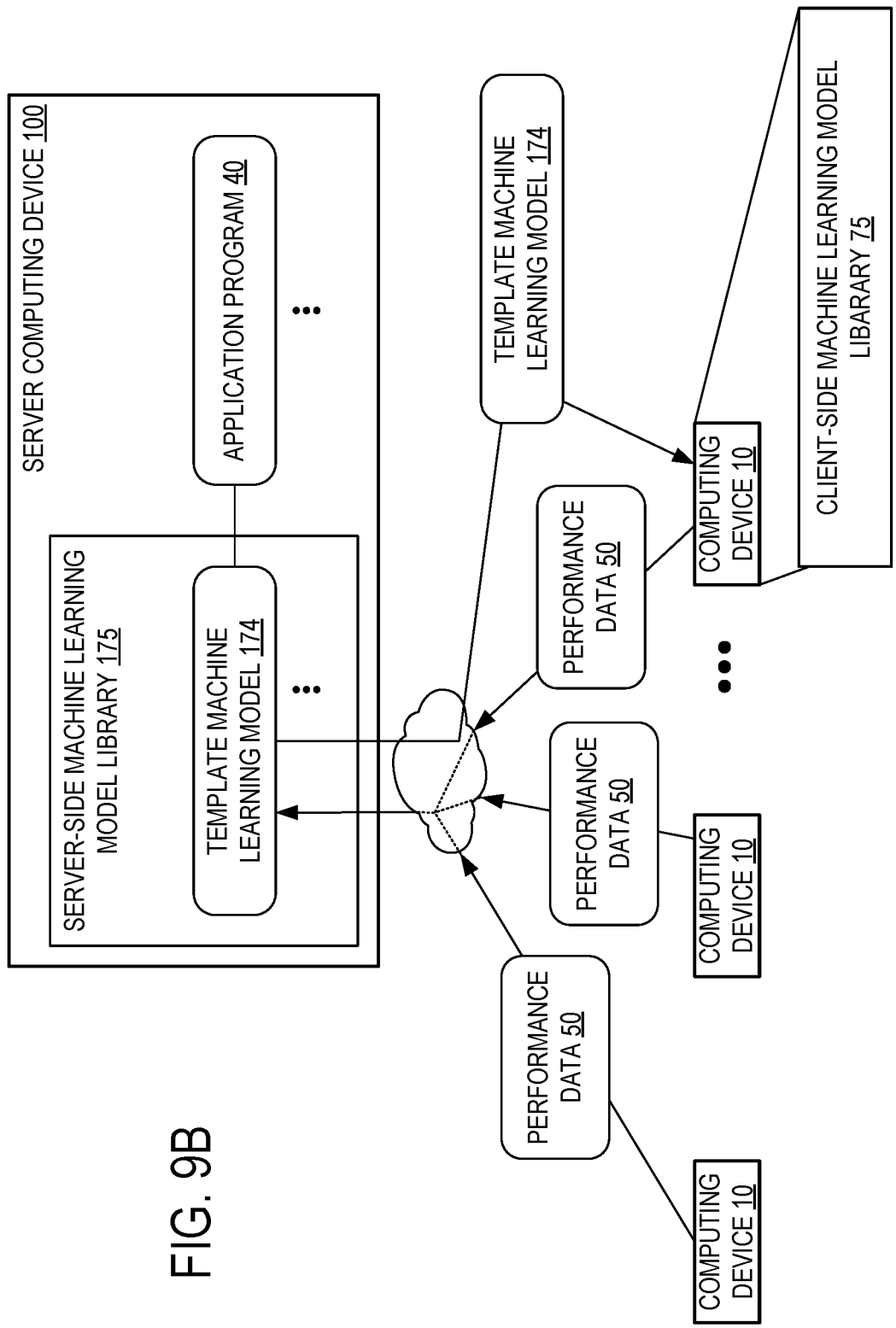
FIG. 9B schematically shows the server computing device when the template machine learning model is generated, according to the example of FIG. 9A.

FIG. 9B shows the server computing device 100 in additional detail when the template machine learning model 174 is generated. The server computing device 100 may be configured to store a server-side machine learning model library 175 including a plurality of template machine learning models 174 for the plurality of application programs 40. When one or more computing devices 10 execute an application program 40 of the plurality of application programs 40, the server computing device 100 may be configured to receive, via a network, respective performance data 50 from each of the plurality of computing devices 10 on which the application program 40 is executed. The collection of performance data 50 received from each of the plurality of computing devices 10 may be used as a training data set with which the server computing device 100 may train the template machine learning model 174. The server computing device 174 may be further configured to output the template machine learning model 174 to the plurality of computing devices 10 after training the template machine learning model 174. For example, a new version of the template machine learning model 174 may be trained at the server computing device 100 and transmitted to each of the computing devices 10 subsequently to performing a software update on the application program 40 at the plurality of computing devices 10. Accordingly, the template machine learning model 174 may be updated to reflect changes in the performance of the application program 40 resulting from the update. With this approach, the template machine learning model 174 can be updated based on the performance data 50 not only of a single computing device 10, but of a plurality of computing devices executing the same application program.

Figure 10A:
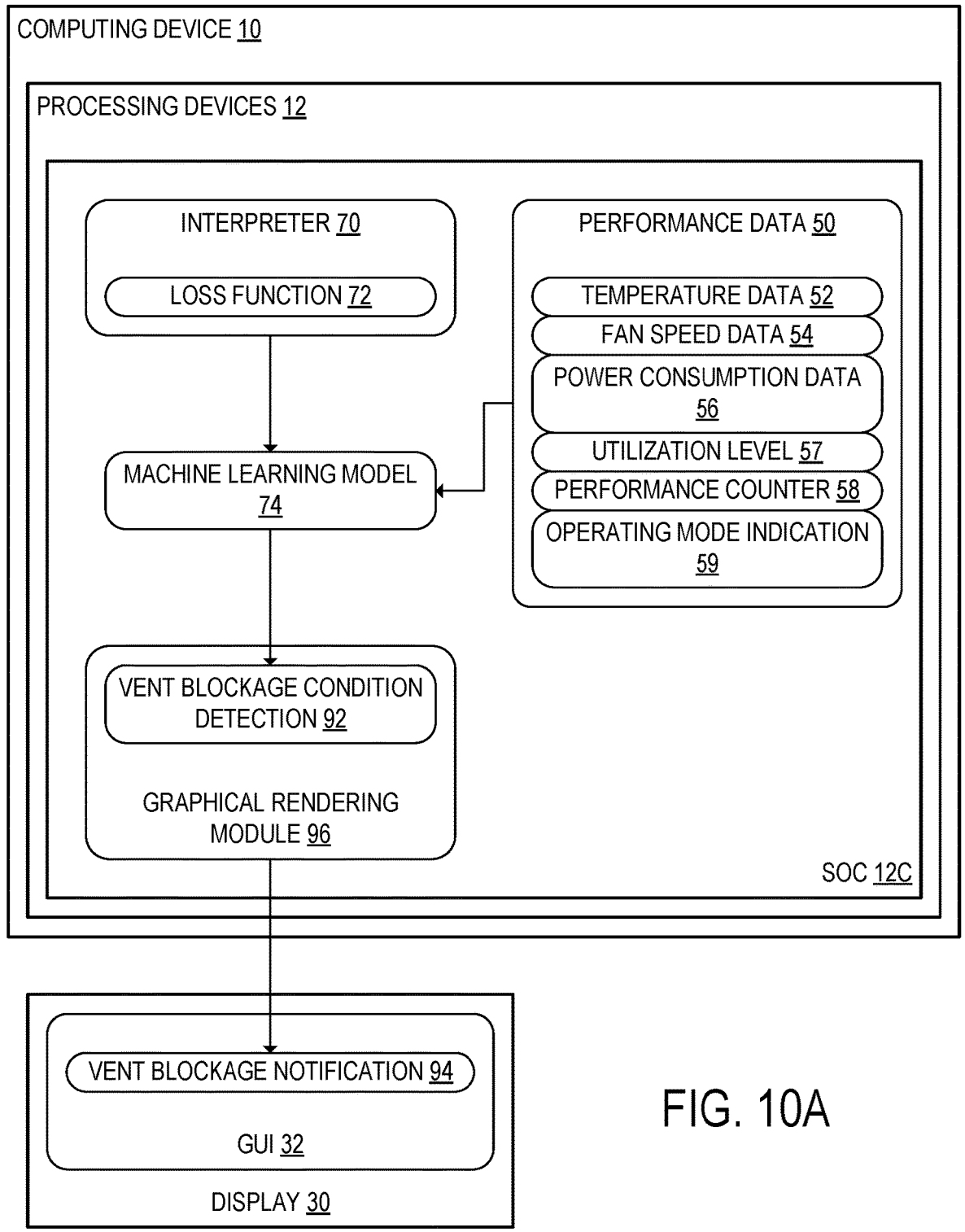
FIG. 10A schematically shows the computing device when the computing device is configured to detect a vent blockage condition using the machine learning model, according to the example of FIG. 1.

FIG. 10A shows the computing device 10 in an example in which the one or more processing devices 12 are further configured to detect, at least in part at the machine learning model 74, a vent blockage condition at the computing device 10. The vent blockage condition is a condition in which a vent 28 in the case 26 is obstructed. For example, the vent 28 may be obstructed by dust or by an object adjacent to the vent 28. As depicted in the example of FIG. 10A, the machine learning model 74 may be configured to output a vent blockage condition detection 92 when the machine learning model 74 determines that the vent blockage condition has occurred. The one or more processing devices 12 may, for example, determine that the vent blockage condition has occurred when the machine learning model 74 determines that the temperature indicated by the temperature data 52 is abnormally high given the fan speed indicated by the fan speed data 54.

Figure 10B:
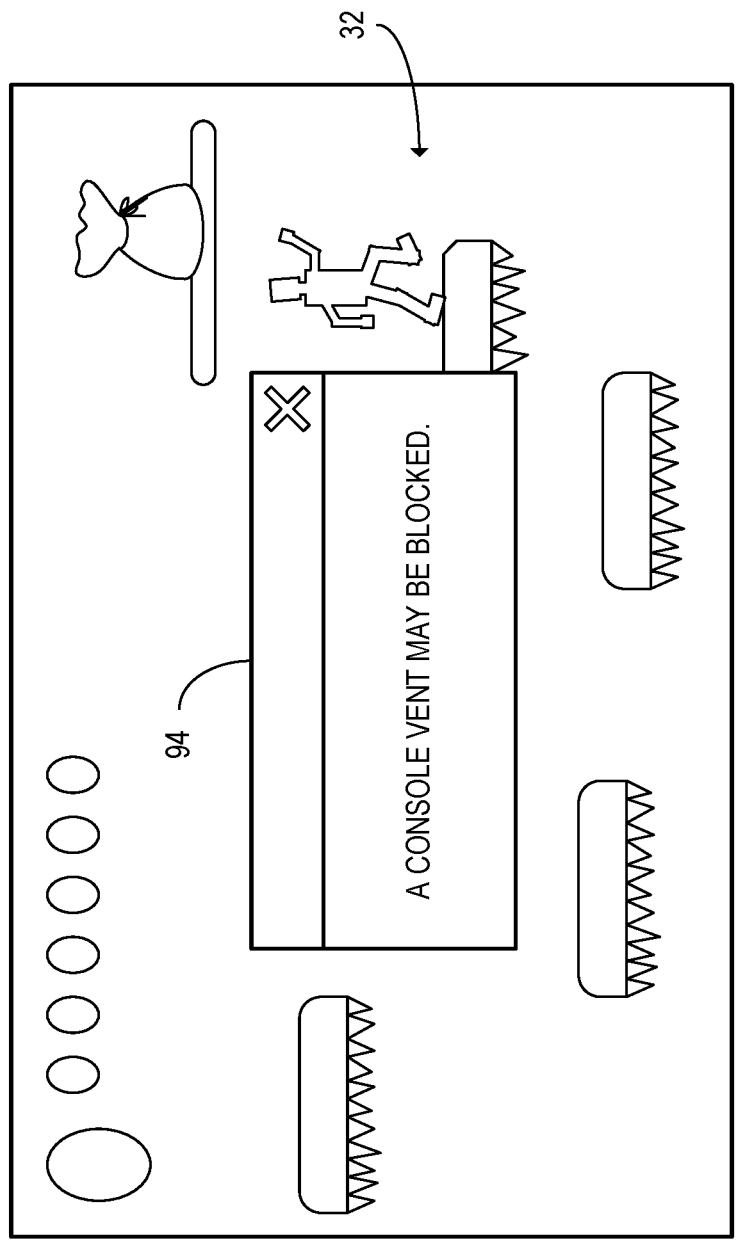
FIG. 10B shows an example view of a graphical user interface (GUI) including a vent blockage notification, according to the example of FIG. 10A.

In response to detecting the vent blockage condition, the one or more processing devices 12 may be further configured to output a vent blockage notification 94 for display at the GUI 32. The vent blockage notification 94 may be generated at a graphical rendering module 96 that is executed at the one or more processing devices 12 and is configured to receive the vent blockage condition detection 92 from the machine learning model 74. An example view of the GUI 32 when the vent blockage notification 94 is displayed is shown in FIG. 10B.

Figure 11A:
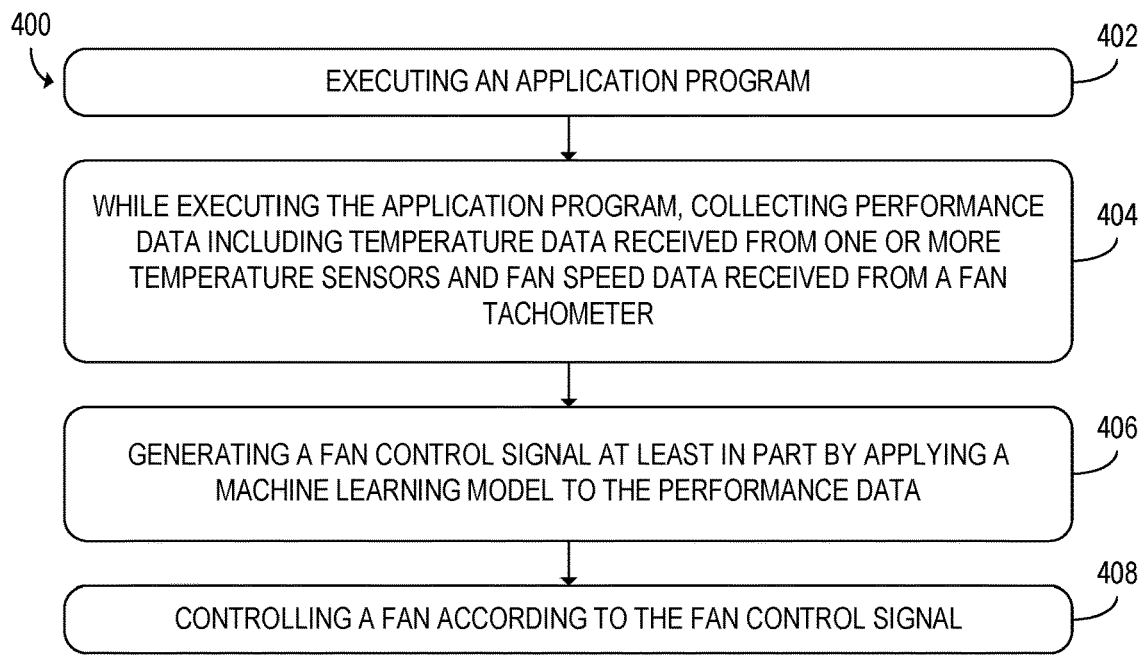
FIG. 11A shows a flowchart of an example method for use with a computing device to control a fan included in the computing device, according to the example of FIG. 1.

FIG. 11A shows a flowchart of an example method 400 for use with a computing device to control a fan included in the computing device. The method 400 of FIG. 11A may be performed at the computing device 10 of FIG. 1 or at some other computing device. The method 400 may be performed at one or more processing devices, which may include a CPU, a GPU, an SoC, and/or one or more other types of processing devices.

At step 402, the method 400 may include executing an application program. For example, the application program may be a video game. Alternatively, some other type of application program may be executed.

At step 404, the method 400 may further include collecting performance data while executing the application program. The performance data may include temperature data received from one or more temperature sensors included in the computing device. The one or more temperature sensors may be configured to measure the respective temperatures of one or more components of the computing device, such as the one or more processing devices, while the application program is executed. The performance data may further include fan speed data received from a fan tachometer. The fan tachometer may be configured to measure the rotation speed of a fan included in the computing device. In addition to the temperature data and the fan speed data, the performance data may further include power consumption data for the one or more processing devices. Additionally or alternatively, the performance data may include the performance data further includes one or more respective utilization levels and/or one or more respective performance counters of the one or more processing devices.

In some examples, the performance data may further include one or more operating mode indications of an operating mode in which the application program is executed. The operating mode may be defined at least in part by a setting of the application program or by one or more computational processes or events indicated as occurring during execution of the application program. In examples in which the application program is a video game, the operating mode may, for example, be a graphics setting for the video game, a condition in which a particular area or object in a game world is loaded, a condition in which a physics engine is executed, a single-player or multiplayer mode, a condition in which a specific user input or user input combination is received, or some other mode or scenario that may occur when running the video game.

At step 406, the method 400 may further include generating a fan control signal at least in part by applying a machine learning model to the performance data. For example, the machine learning model may be a reinforcement learning model. In some examples, the machine learning model may be further configured to receive, as an additional input, a temperature setpoint output by a temperature control program. The fan control signal may, in some examples, be generated as the output of the machine learning model. In other examples, the fan control signal may be generated at one or more additional modules configured to receive an output from the machine learning model, as discussed in further detail below.

In examples in which the machine learning model is a reinforcement learning model, the machine learning model may have a loss function including a fan speed term and a temperature overshoot term. In some examples, the loss function may further include a fan acceleration term. The fan speed term may be computed as a function of a fan speed included in the fan speed data and may increase as the fan speed increases. The temperature overshoot term may be added to the loss function when the temperature data indicates a temperature above a predetermined temperature threshold. Accordingly, the reinforcement learning model may be penalized when the temperature the predetermined temperature threshold. The fan acceleration term may be computed as a function of a time derivative of the fan speed and may increase as the magnitude of the time derivative of the fan speed increases. Thus, the reinforcement learning model may be penalized for rapid changes in fan speed that may distract the user.

At step 408, the method 400 may further include controlling a fan according to the fan control signal. The fan control signal may be transmitted from the one or more processing devices to an SMC configured to control the fan speed. In some examples, the fan control signal may be a duty cycle for the fan. In other examples, the fan control signal may be a digital signal that is further processed to obtain the fan duty cycle.

Figure 11B:
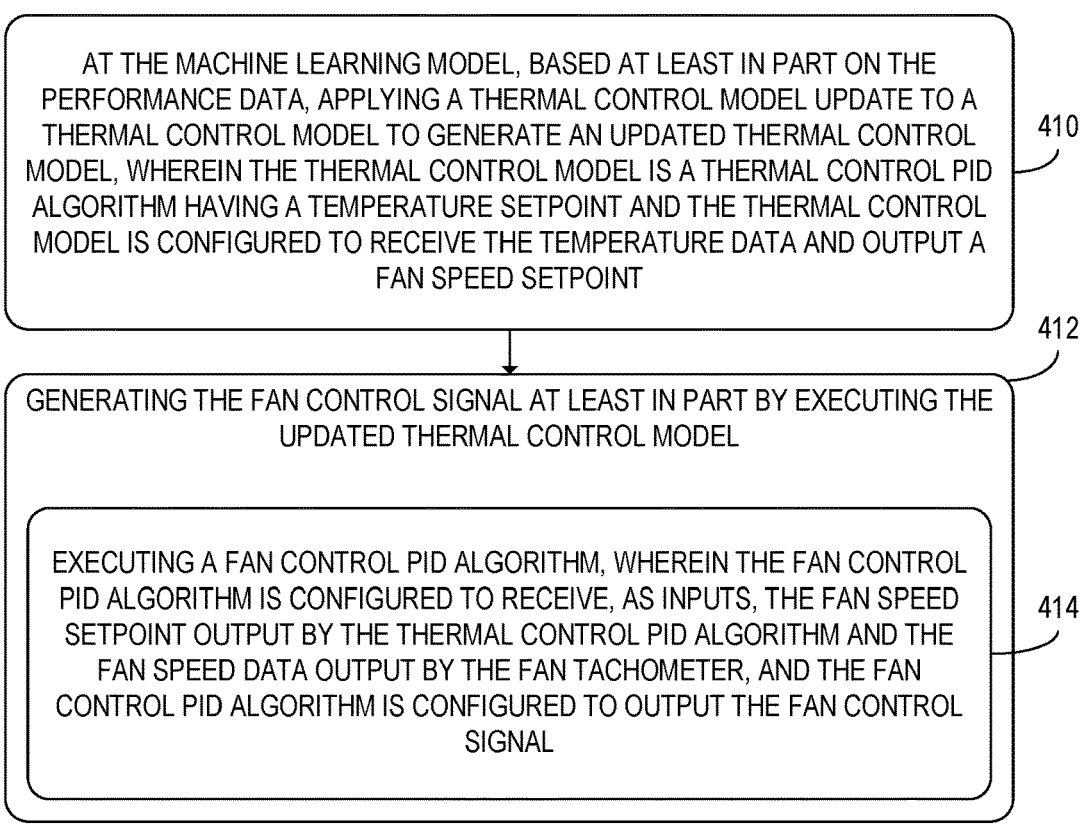
FIG. 11B shows additional steps of the method that may be performed in examples in which the one or more processing devices are further configured to execute a thermal control model, according to the example of FIG. 11A.

FIG. 11B shows additional steps of the method 400 that may be performed in examples in which the one or more processing devices are further configured to execute a thermal control model configured to receive output from the machine learning model. At step 410, the method 400 may further include applying a thermal control model update to the thermal control model to generate an updated thermal control model. The thermal control model update may be generated at the machine learning model based at least in part on the performance data. In the example of FIG. 11B, the thermal control model is a thermal control PID algorithm that has a temperature setpoint. The thermal control model may be configured to receive the temperature data and output a fan speed setpoint. At the thermal control PID algorithm, a temperature error between the temperature setpoint and a temperature indicated by the temperature data may be computed. The fan speed setpoint may then be generated as a sum of a proportional term that is proportional to the temperature error, an integral term that is proportional to an integral of the temperature error over time, and a derivative term that is proportional to a time derivative of the temperature error. The proportional term, the integral term, and the derivative term may have respective coefficients that may be updated by the thermal control model update. Additionally or alternatively, the thermal control model update may include a temperature setpoint offset configured to be added to the temperature setpoint when the temperature error is computed.

At step 412, the method 400 may further include generating the fan control signal at least in part by executing the updated thermal control model. In some examples, the updated thermal control model may be configured to output a fan speed setpoint. In such examples, at step 414, step 412 may further include executing a fan control PID algorithm. The fan control PID algorithm may be configured to receive, as inputs, the fan speed setpoint output by the thermal control PID algorithm and the fan speed data output by the fan tachometer. The fan control PID algorithm may be configured to output the fan control signal. At the fan control PID algorithm, a fan speed error between the fan speed setpoint and a fan speed indicated by the fan speed data may be computed. The fan control signal may then be generated as a sum of a proportional term that is proportional to the fan speed error, an integral term that is proportional to an integral of the fan speed error over time, and a derivative term that is proportional to a time derivative of the fan speed error. The proportional term, the integral term, and the derivative term may have respective coefficients.

Figure 11C:
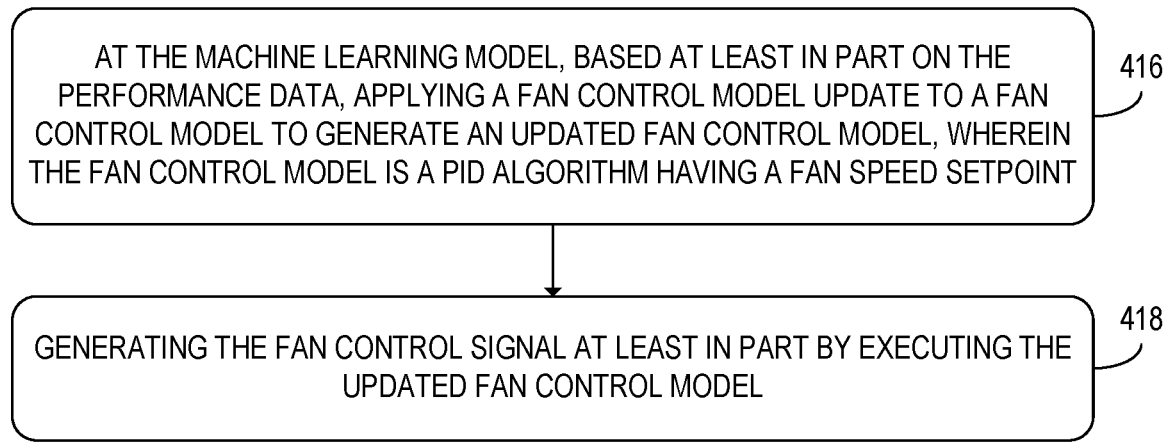
FIG. 11C shows additional steps of the method that may be performed when the method includes executing a fan control PID algorithm, according to the example of FIG. 11A.

FIG. 11C shows additional steps of the method 400 that may be performed when the method 400 includes executing a fan control PID algorithm. The steps of FIG. 11C may be performed in examples in which a thermal control model is also executed or in examples in which the machine learning model is configured to directly output a fan speed setpoint. At step 416, the method 400 may further include applying a fan control model update to a fan control model to generate an updated fan control model. The fan control model may be generated at the machine learning model based at least in part on the performance data. The fan control model may be a PID algorithm having a fan speed setpoint. At step 418, the method 400 may further include generating the fan control signal at least in part by executing the updated fan control model.

Figure 11D:
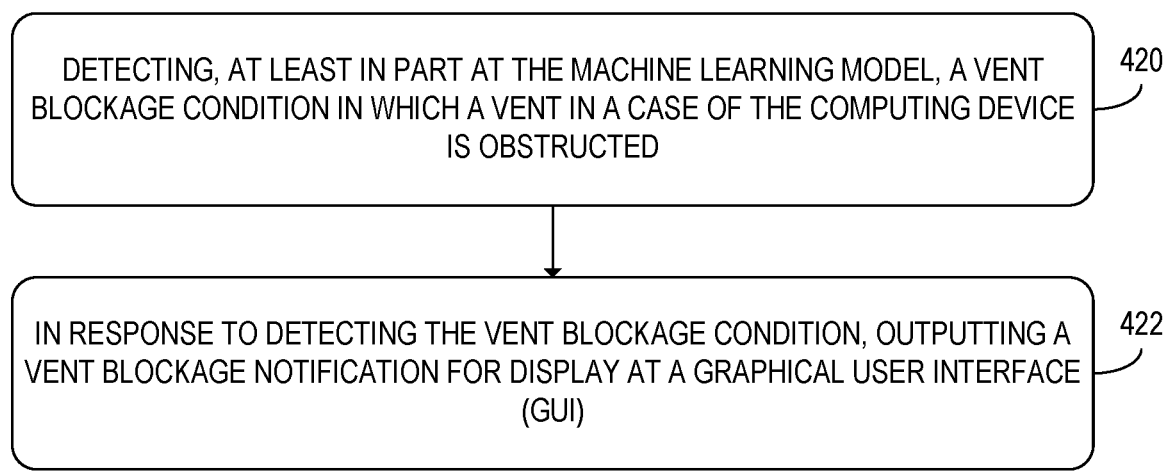
FIG. 11D shows additional steps of the method that may be performed when a vent in a case of the computing device is determined to be obstructed, according to the example of FIG. 11A.

FIG. 11D shows additional steps of the method 400 that may be performed in some examples. At step 420, the method 400 may further include detecting, at least in part at the machine learning model, a vent blockage condition in which a vent in a case of the computing device is obstructed. The machine learning model may, for example, detect that the temperature indicated by the temperature data is abnormally high given the received values of the fan speed and the power utilization of the one or more processing devices. At step 422, in response to detecting the vent blockage condition, the method 400 may further include outputting a vent blockage notification for display at a GUI. The GUI may be displayed on a display that is communicatively coupled to the one or more processing devices as an output device. Thus, the user may be notified that a vent of the computing device may be blocked.

Using the devices and methods discussed above, a machine learning model may be utilized when setting the fan speed for a fan included in a computing device. The speed and acceleration of the fan may be set such that the fan is unlikely to distract the user while also avoiding temperatures at which components of the computing device overheat. The machine learning model may be specific to the application program and may reflect trends of hardware utilization that frequently occur when the application program is executed. In addition, the machine learning model may be received from a server computing device as a template machine learning model and may be customized for the individual computing device via additional training. This customization may account for hardware differences between computing devices and for characteristics of the physical environment in which the computing device typically operates. Accordingly, using the systems and methods discussed above, the fan speed for a computing device may be set in a manner that is unobtrusive to the user and that allows for sufficient cooling of device components.

In some embodiments, the methods and processes described herein may be tied to a computing system of one or more computing devices. In particular, such methods and processes may be implemented as a computer-application program or service, an application-programming interface (API), a library, and/or other computer-program product.

Figure 12:
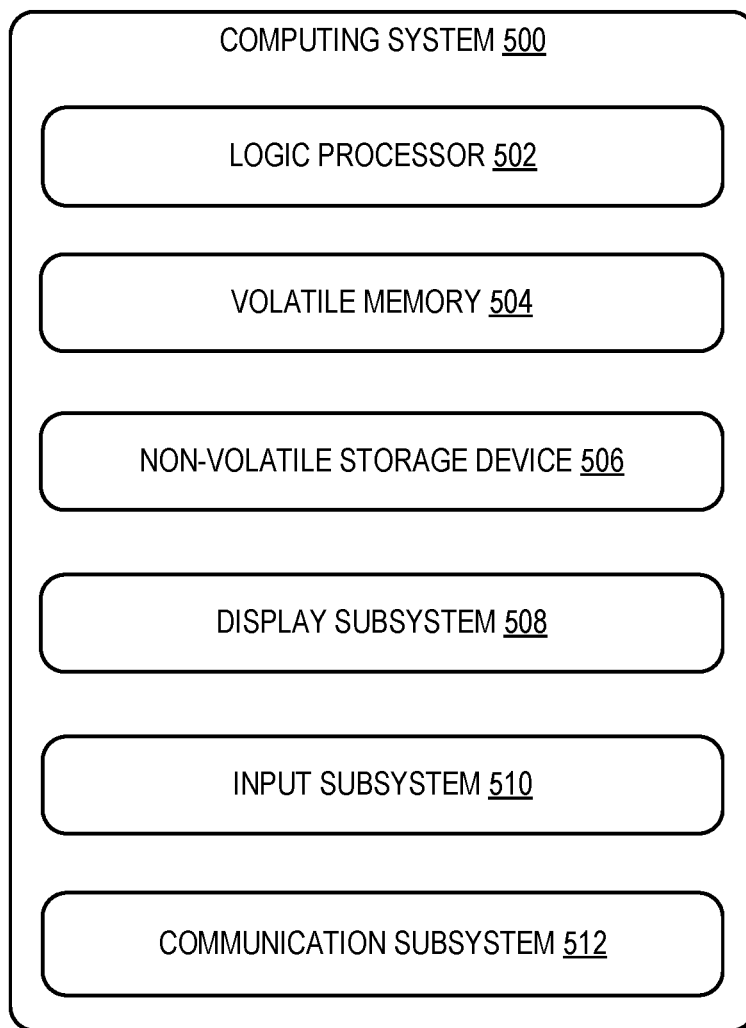
FIG. 12 shows a schematic view of an example computing system in which the computing device of FIG. 1 may be instantiated.

FIG. 12 schematically shows a non-limiting embodiment of a computing system 500 that can enact one or more of the methods and processes described above. Computing system 500 is shown in simplified form. Computing system 500 may embody the computing device 10 described above and illustrated in FIG. 1. Components of the computing system 500 may be included in one or more personal computers, server computers, tablet computers, home-entertainment computers, network computing devices, game consoles, mobile computing devices, mobile communication devices (e.g., smart phone), and/or other computing devices, and wearable computing devices such as smart wristwatches and head mounted augmented reality devices.

Computing system 500 includes a logic processor 502 volatile memory 504, and a non-volatile storage device 506. Computing system 500 may optionally include a display subsystem 508, input subsystem 510, communication sub system 512, and/or other components not shown in FIG. 12.

Logic processor 502 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 502 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 506 includes one or more physical devices configured to hold instructions executable by the logic processors to implement the methods and processes described herein. When such methods and processes are implemented, the state of non-volatile storage device 506 may be transformed—e.g., to hold different data.

Non-volatile storage device 506 may include physical devices that are removable and/or built-in. Non-volatile storage device 506 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 506 may include nonvolatile, dynamic, static, read/write, read-only, sequential-access, location-addressable, file-addressable, and/or content-addressable devices. It will be appreciated that non-volatile storage device 506 is configured to hold instructions even when power is cut to the non-volatile storage device 506.

Volatile memory 504 may include physical devices that include random access memory. Volatile memory 504 is typically utilized by logic processor 502 to temporarily store information during processing of software instructions. It will be appreciated that volatile memory 504 typically does not continue to store instructions when power is cut to the volatile memory 504.

Aspects of logic processor 502, volatile memory 504, and non-volatile storage device 506 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 500 typically implemented in software by a processor to perform a particular function using portions of volatile memory, which function involves transformative processing that specially configures the processor to perform the function. Thus, a module, program, or engine may be instantiated via logic processor 502 executing instructions held by non-volatile storage device 506, using portions of volatile memory 504. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 508 may be used to present a visual representation of data held by non-volatile storage device 506. The visual representation may take the form of a graphical user interface (GUI). As the herein described methods and processes change the data held by the non-volatile storage device, and thus transform the state of the non-volatile storage device, the state of display subsystem 508 may likewise be transformed to visually represent changes in the underlying data. Display subsystem 508 may include one or more display devices utilizing virtually any type of technology. Such display devices may be combined with logic processor 502, volatile memory 504, and/or non-volatile storage device 506 in a shared enclosure, or such display devices may be peripheral display devices.

When included, input subsystem 510 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 512 may be configured to communicatively couple various computing devices described herein with each other, and with other devices. Communication subsystem 512 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 500 to send and/or receive messages to and/or from other devices via a network such as the Internet.

The following paragraphs discuss several aspects of the present disclosure. According to one aspect of the present disclosure, a computing device is provided, including one or more processing devices, one or more temperature sensors, a fan, and a fan tachometer. The one or more processing devices may be configured to execute an application program. While executing the application program, the one or more processing devices may be further configured to collect performance data including temperature data received from the one or more temperature sensors and fan speed data received from the fan tachometer. The one or more processing devices may be further configured to generate a fan control signal at least in part by applying a machine learning model to the performance data. The one or more processing devices may be further configured to control the fan according to the fan control signal.

According to this aspect, the machine learning model may be a reinforcement learning model. The machine learning model may have a loss function including a fan speed term computed as a function of a fan speed included in the fan speed data. The loss function may further include a temperature overshoot term added to the loss function when the temperature data indicates a temperature above a predetermined temperature threshold.

According to this aspect, the loss function may further include a fan acceleration term computed as a function of a time derivative of the fan speed.

According to this aspect, the one or more processing devices may be configured to, at the machine learning model, based at least in part on the performance data, apply a thermal control model update to a thermal control model to generate an updated thermal control model. The one or more processing devices may be further configured to generate the fan control signal at least in part by executing the updated thermal control model.

According to this aspect, the thermal control model may be a thermal control proportional-integral-derivative (PID) algorithm having a temperature setpoint. The thermal control model may be configured to receive the temperature data and output a fan speed setpoint.

According to this aspect, at the machine learning model, the one or more processing devices may be configured to apply the thermal control model update to the thermal control model at least in part by modifying one or more coefficients of the thermal control PID algorithm.

According to this aspect, at the machine learning model, the one or more processing devices may be configured to apply the thermal control model update to the thermal control model at least in part by applying a temperature setpoint offset to the temperature setpoint of the thermal control PID algorithm.

According to this aspect, the one or more processing devices may be further configured to execute a fan control PID algorithm. The fan control PID algorithm may be configured to receive, as inputs, the fan speed setpoint output by the thermal control PID algorithm and the fan speed data output by the fan tachometer. The fan control PID algorithm may be configured to output the fan control signal.

According to this aspect, the one or more processing devices may be configured to, at the machine learning model, based at least in part on the performance data, apply a fan control model update to a fan control model to generate an updated fan control model. The fan control model may be a proportional-integral-derivative (PID) algorithm having a fan speed setpoint. The one or more processing devices may be further configured to generate the fan control signal at least in part by executing the updated fan control model.

According to this aspect, the performance data may further include one or more operating mode indications of an operating mode in which the application program is executed.

According to this aspect, the performance data may further include one or more respective utilization levels and/or one or more respective performance counters of the one or more processing devices.

According to this aspect, the performance data may further include power consumption data of the one or more processing devices.

According to this aspect, the one or more processing devices may be further configured to detect, at least in part at the machine learning model, a vent blockage condition in which a vent in a case of the computing device is obstructed. In response to detecting the vent blockage condition, the one or more processing devices may be further configured to output a vent blockage notification for display at a graphical user interface (GUI).

According to this aspect, the computing device may further include memory configured to store a plurality of machine learning models including the machine learning model. The plurality of machine learning models may be respectively associated with a plurality of application programs including the application program.

According to another aspect of the present disclosure, a method for use with a computing device is provided. The method may include executing an application program. While executing the application program, the method may further include collecting performance data including temperature data received from one or more temperature sensors and fan speed data received from a fan tachometer. The method may further include generating a fan control signal at least in part by applying a machine learning model to the performance data. The method may further include controlling a fan according to the fan control signal.

According to this aspect, the machine learning model may be a reinforcement learning model. The machine learning model may have a loss function including a fan speed term computed as a function of a fan speed included in the fan speed data. The loss function may further include a temperature overshoot term added to the loss function when the temperature data indicates a temperature above a predetermined temperature threshold.

According to this aspect, the method may further include, at the machine learning model, based at least in part on the performance data, applying a thermal control model update to a thermal control model to generate an updated thermal control model. The thermal control model may be a thermal control proportional-integral-derivative (PID) algorithm having a temperature setpoint. The thermal control model may be configured to receive the temperature data and output a fan speed setpoint. The method may further include generating the fan control signal at least in part by executing the updated thermal control model.

According to this aspect, the method may further include further comprising executing a fan control PID algorithm. The fan control PID algorithm may be configured to receive, as inputs, the fan speed setpoint output by the thermal control PID algorithm and the fan speed data output by the fan tachometer. The fan control PID algorithm may be configured to output the fan control signal.

According to this aspect, at the machine learning model, the method may further include, based at least in part on the performance data, applying a fan control model update to a fan control model to generate an updated fan control model. The fan control model may be a proportional-integral-derivative (PID) algorithm having a fan speed setpoint. The method may further include generating the fan control signal at least in part by executing the updated fan control model.

According to another aspect of the present disclosure, a computing device is provided, including one or more processing devices, one or more temperature sensors, a fan, and a fan tachometer. The one or more processing devices may be configured to receive a reinforcement learning model from a server computing device. The one or more processing devices may be further configured to execute an application program. While executing the application program, the one or more processing devices may be further configured to collect performance data including temperature data received from the one or more temperature sensors and fan speed data received from the fan tachometer. The one or more processing devices may be further configured to generate a fan control signal at least in part by applying the reinforcement learning model to the performance data. The one or more processing devices may be further configured to control the fan according to the fan control signal. The one or more processing devices may be further configured to perform additional training on the reinforcement learning model based at least in part on the performance data and a loss function of the reinforcement learning model.

"And/or" as used herein is defined as the inclusive or v, as specified by the following truth table:

| A | B | A V B |
|---|---|-------|
| True | True | True |
| True | False | True |
| False | True | True |
| False | False | False |

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A computing device comprising:
one or more processing devices;
one or more temperature sensors;
a fan; and
a fan tachometer;
wherein the one or more processing devices are configured to:
execute an application program;
while executing the application program, collect performance data including:
temperature data received from the one or more temperature sensors; and
fan speed data received from the fan tachometer;
generate a fan control signal at least in part by applying a machine learning model to the performance data, wherein:
the machine learning model is a reinforcement learning model; and
the machine learning model has a loss function including:
a fan speed term computed as a function of a fan speed included in the fan speed data; and
a temperature overshoot term added to the loss function when the temperature data indicates a temperature above a predetermined temperature threshold; and
control the fan according to the fan control signal.

2. The computing device of claim 1, wherein the loss function further includes a fan acceleration term computed as a function of a time derivative of the fan speed.

3. The computing device of claim 1, wherein the one or more processing devices are configured to:
at the machine learning model, based at least in part on the performance data, apply a thermal control model update to a thermal control model to generate an updated thermal control model; and
generate the fan control signal at least in part by executing the updated thermal control model.

4. The computing device of claim 3, wherein:
the thermal control model is a thermal control proportional-integral-derivative (PID) algorithm having a temperature setpoint; and
the thermal control model is configured to receive the temperature data and output a fan speed setpoint.

5. The computing device of claim 4, wherein, at the machine learning model, the one or more processing devices are configured to apply the thermal control model update to the thermal control model at least in part by modifying one or more coefficients of the thermal control PID algorithm.

6. The computing device of claim 4, wherein, at the machine learning model, the one or more processing devices are configured to apply the thermal control model update to the thermal control model at least in part by applying a temperature setpoint offset to the temperature setpoint of the thermal control PID algorithm.

7. The computing device of claim 4, wherein:
the one or more processing devices are further configured to execute a fan control PID algorithm;
the fan control PID algorithm is configured to receive, as inputs, the fan speed setpoint output by the thermal control PID algorithm and the fan speed data output by the fan tachometer; and
the fan control PID algorithm is configured to output the fan control signal.

8. The computing device of claim 1, wherein the one or more processing devices are configured to:
at the machine learning model, based at least in part on the performance data, apply a fan control model update to a fan control model to generate an updated fan control model, wherein the fan control model is a proportional-integral-derivative (PID) algorithm having a fan speed setpoint; and
generate the fan control signal at least in part by executing the updated fan control model.

9. The computing device of claim 1, wherein:
the performance data further includes one or more operating mode indications of an operating mode in which the application program is executed; and
the operating mode is a setting of the application program or a state of executing a predefined computational process included in the application program.

10. The computing device of claim 1, wherein the performance data further includes one or more respective utilization levels and/or one or more respective performance counters of the one or more processing devices.

11. The computing device of claim 1, wherein the performance data further includes power consumption data of the one or more processing devices.

12. The computing device of claim 1, wherein the one or more processing devices are further configured to:
detect, at least in part at the machine learning model, a vent blockage condition in which a vent in a case of the computing device is obstructed; and
in response to detecting the vent blockage condition, output a vent blockage notification for display at a graphical user interface (GUI).

13. The computing device of claim 1, further comprising memory configured to store a plurality of machine learning models including the machine learning model, wherein the plurality of machine learning models are configured to generate the fan control signal during execution of a respective plurality of application programs including the application program.

14. A method for use with a computing device, the method comprising:
executing an application program;
while executing the application program, collecting performance data including:
temperature data received from one or more temperature sensors; and
fan speed data received from a fan tachometer;
generating a fan control signal at least in part by applying a machine learning model to the performance data, wherein:
the machine learning model is a reinforcement learning model; and
the machine learning model has a loss function including:
a fan speed term computed as a function of a fan speed included in the fan speed data; and
a temperature overshoot term added to the loss function when the temperature data indicates a temperature above a predetermined temperature threshold; and
controlling a fan according to the fan control signal.

15. The method of claim 14, further comprising:
at the machine learning model, based at least in part on the performance data, applying a thermal control model update to a thermal control model to generate an updated thermal control model, wherein:
the thermal control model is a thermal control proportional-integral-derivative (PID) algorithm having a temperature setpoint; and
the thermal control model is configured to receive the temperature data and output a fan speed setpoint; and
generating the fan control signal at least in part by executing the updated thermal control model.

16. The method of claim 15, further comprising executing a fan control PID algorithm, wherein:
the fan control PID algorithm is configured to receive, as inputs, the fan speed setpoint output by the thermal control PID algorithm and the fan speed data output by the fan tachometer; and
the fan control PID algorithm is configured to output the fan control signal.

17. The method of claim 14, further comprising:
at the machine learning model, based at least in part on the performance data, applying a fan control model update to a fan control model to generate an updated fan control model, wherein the fan control model is a proportional-integral-derivative (PID) algorithm having a fan speed setpoint; and
generating the fan control signal at least in part by executing the updated fan control model.

18. A computing device comprising:
one or more processing devices;
one or more temperature sensors;
a fan; and
a fan tachometer;
wherein the one or more processing devices are configured to:
receive a reinforcement learning model from a server computing device;
execute an application program;
while executing the application program, collect performance data including:
temperature data received from the one or more temperature sensors; and
fan speed data received from the fan tachometer;
generate a fan control signal at least in part by applying the reinforcement learning model to the performance data, wherein the reinforcement learning model has a loss function including:
a fan speed term computed as a function of a fan speed included in the fan speed data; and
a temperature overshoot term added to the loss function when the temperature data indicates a temperature above a predetermined temperature threshold;
control the fan according to the fan control signal; and
perform additional training on the reinforcement learning model based at least in part on the performance data and the loss function of the reinforcement learning model.

* * * * *